United States Patent
Lee et al.

(10) Patent No.: US 8,139,949 B2
(45) Date of Patent: Mar. 20, 2012

(54) ELECTRICAL SIGNAL TRANSMISSION MODULE, METHOD OF TRANSMITTING ELECTRIC SIGNALS AND ELECTRICAL INSPECTION APPARATUS HAVING THE SAME

(75) Inventors: Sang-Hoon Lee, Hwaseong-si (KR);
Ho-Jeong Choi, Yongin-si (KR);
Se-Jang Oh, Seongnam-si (KR);
Young-Soo An, Yongin-si (KR);
Gyu-Yeol Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 814 days.

(21) Appl. No.: 12/179,015

(22) Filed: Jul. 24, 2008

(65) Prior Publication Data
US 2009/0028571 A1    Jan. 29, 2009

(30) Foreign Application Priority Data
Jul. 27, 2007  (KR) .................... 10-2007-0075814

(51) Int. Cl.
*H04B 10/12* (2006.01)
(52) U.S. Cl. .............................. 398/164; 385/101
(58) Field of Classification Search ................. 398/9, 16, 398/22–25, 33, 85, 164; 385/101
See application file for complete search history.

(56) References Cited

U.S. PATENT DOCUMENTS

| | | | |
|---|---|---|---|
| 7,109,739 B2 | 9/2006 | Gothoskar et al. | |
| 7,130,511 B2* | 10/2006 | Riester et al. | 385/101 |
| 7,974,673 B2* | 7/2011 | Jacobsen et al. | 600/372 |
| 2006/0109015 A1 | 5/2006 | Thacker et al. | |
| 2007/0237472 A1* | 10/2007 | Aronson et al. | 385/101 |
| 2008/0037941 A1* | 2/2008 | Mallya et al. | 385/101 |
| 2008/0205829 A1* | 8/2008 | Jacobsen et al. | 385/101 |

FOREIGN PATENT DOCUMENTS

JP   7-58166   3/1995

* cited by examiner

*Primary Examiner* — Leslie Pascal
(74) *Attorney, Agent, or Firm* — F. Chau & Associates, LLC

(57) ABSTRACT

An electrical signal transmission module includes a plurality of optical signal lines and a plurality of electrical signal lines. The plurality of optical signal lines converting a first externally input electrical signal into an optical signal, transmitting the optical signal, converting the optical signal back into the first electrical signal, and outputting the first electrical signal. The plurality of electrical signal lines transmitting a second externally input electrical signal and outputting the second electrical signal.

13 Claims, 7 Drawing Sheets

ELECTRICAL SIGNAL TRANSMISSION MODULE, METHOD OF TRANSMITTING ELECTRIC SIGNALS AND ELECTRICAL INSPECTION APPARATUS HAVING THE SAME

CROSS-REFERENCE TO RELATED APPLICATION

This application is based on and claims priority under 35 U.S.C. §119 to Korean Patent Application No. 2007-75814, filed on Jul. 27, 2007, the contents of which are herein incorporated by reference in their entirety.

BACKGROUND OF THE INVENTION

1. Technical Field

The present disclosure relates to an electrical signal transmission module, a method of transmitting electrical signals, and an electrical inspection apparatus. More particularly, to a module and a method for transmitting electrical signals to inspect a semiconductor device and an electrical inspection apparatus having the module.

2. Discussion of the Related Art

Semiconductor devices are manufactured by a fabrication process for forming electric circuits including electric elements on a semiconductor substrate such as a silicon wafer. An electrical die sorting (EDS) process is used for inspecting electrical properties of chips formed by the fabrication process, and a packaging process is used for sealing the chips with resin such as epoxy and for sorting the chips.

The EDS process applies an electrical signal to the chip formed on the silicon wafer and obtains an output signal from the chip to determine whether the chip is defective. The EDS process is performed by an electrical inspection apparatus including probes that directly make contact with pads of the chip.

As the operation speeds of semiconductor devices increase to higher than about 1 GHz, the electrical inspection apparatus is required to operate at a high speed in order to accurately inspect the semiconductor device.

FIG. 1 is a block diagram illustrating a conventional electrical inspection apparatus.

Referring to FIG. 1, the electrical inspection apparatus 1 includes a test header 10, a first connector 20, a performance substrate 30, a second connector 40, a main printed circuit board (PCB) 50, an elastic interconnector 60, a subsidiary PCB 70, and a probe 80.

An electrical test signal from a tester (not illustrated) is input into a semiconductor device through the test header 10 to the probe 80, and then an electrical signal generated by an internal operation of the semiconductor device is input into the tester through the probe 70 to the test header 10. The tester analyses the electrical signal to inspect the semiconductor device.

In order to accurately inspect the semiconductor device, the electrical inspection apparatus must transmit the input/output (I/O) electrical signal to/from the tester without loss or distortion of the electrical signal. The electrical inspection apparatus including the PCB may accurately inspect a semiconductor device having an operation speed of less than about 500 MHz without loss of the electrical signal or loss of power.

However, when the operation speed of the semiconductor device is higher than about 1 GHz, because the PCB includes glass fiber having an epoxy resin, loss of amplitude and distortion of the waveform of the electrical signal may occur. Further, the loss of the amplitude and the distortion of the waveform of the electrical signal may occur due to crosstalk between electrical signal lines of the PCB. Accordingly, the electrical inspection apparatus may not accurately inspect semiconductor devices having an operation speed of higher than about 1 GHz.

SUMMARY OF THE INVENTION

Exemplary embodiments seek to provide a module for transmitting an electrical signal to inspect a semiconductor device having a high operation speed.

Exemplary embodiments further seek to provide a method of transmitting an electrical signal to inspect a semiconductor device having a high operation speed.

Exemplary embodiments still further seek to provide an electrical inspection apparatus having the module.

An electrical signal transmission module, according to an exemplary embodiment, includes a plurality of optical signal lines converting a first externally input electrical signal into an optical signal, transmitting the optical signal converting the optical signal back into the first electrical signal, and outputting the first electrical signal, and a plurality of electrical signal lines transmitting a second externally input electrical signal and outputting the second electrical signal.

Each of the optical signal lines may include a pair of transmission parts converting the first externally input electrical signal into the optical signal, converting the optical signal back into the first electrical signal, and outputting the first electrical signal, and an optical fiber connecting the transmission parts and transmitting the optical signal.

Each of the transmission parts may include a light transmitter converting the first externally input electrical signal into the optical signal, a light receiver converting the optical signal back into the first electrical signal, an electrical circulator transmitting the first externally input electrical signal to the light transmitter and outputting the first electrical signal that is transmitted from the light receiver, and an optical circulator transmitting the optical signal converted by the light transmitter to the optical fiber and transmitting the optical signal that is transmitted from the optical fiber to the light receiver.

The light transmitter may include a laser diode and the light receiver may include a photodiode or a photodetector.

Each of the electrical signal lines may include a coaxial cable.

Each of the electrical signal lines may further include a ground line.

Each of the electrical signal lines may be surrounded by the optical signal lines.

The optical signal lines may be disposed in a first region and the electrical signal lines may be disposed in a second region adjacent to the first region.

The first electrical signal may be of the same type as the second electrical signal. The first electrical signal and the second electrical signal may be an alternating current (AC) signal.

The first electrical signal may be of a different type from the second electrical signal. The first electrical signal may be an AC signal and the second electrical signal may be a direct current (DC) signal.

An electrical signal transmission module, according to an exemplary embodiment, includes a pair of substrate structures each including first transmission parts and second transmission parts, and interconnectors disposed between the substrate structures. Each of the first transmission parts converts a first externally input electrical signal into an optical signal, transmits the optical signal, converts the optical signal back into the first electrical signal, and outputs the first electrical signal. Each of the second transmission parts transmits a second externally input electrical signal and outputs the second electrical signal. The interconnectors connect the first transmission parts and the second transmission parts, respectively.

Each of the first transmission parts may include a light transmitter converting the first externally input electrical signal into the optical signal, a light receiver converting the optical signal back into the first electrical signal, an electrical circulator transmitting the first externally input electrical signal to the light transmitter and outputting the first electrical signal that is transmitted from the light receiver, and an optical circulator transmitting the optical signal converted by the light transmitter to each of the interconnectors and transmitting the optical signal that is transmitted from each of the interconnectors to the light receiver.

The interconnectors may include optical interconnectors connecting the first transmission parts to one another and transmitting optical signals, and electrical interconnectors connecting the second transmission parts to one another and transmitting electrical signals.

Each of the second transmission parts may be surrounded by a plurality of the first transmission parts.

The first transmission parts may be disposed in a first region and the second transmission parts may be disposed in a second region adjacent to the first region.

A method of transmitting an electrical signal is provided according to an exemplary embodiment. In the method, a first electrical signal and a second electrical signal are externally input. The first externally input electrical signal is converted into an optical signal. The optical signal is transmitted. The transmitted optical signal is converted back into the first electrical signal. The first electrical signal is outputted. The second electrical signal is outputted.

The first electrical signal may be of the same type as the second electrical signal. The first electrical signal and the second electrical signal may be an AC signal.

The first electrical signal may be of a different type from the second electrical signal. The first electrical signal may be an AC signal and the second electrical signal may be a DC signal.

An electrical inspection apparatus, according to an exemplary embodiment, includes an electrical signal transmission module and a substrate structure. The electrical signal transmission module includes a plurality of optical signal lines converting a first externally input electrical signal into an optical signal, transmitting the optical signal, converting the optical signal back into the first electrical signal, and outputting the first electrical signal, and a plurality of electrical signal lines transmitting a second externally input electrical signal and outputting the second electrical signal. The substrate structure is connected to the optical signal lines and the electrical signal lines, the substrate structure including probes formed on a surface of the substrate structure, the probes making contact with an object.

An electrical inspection apparatus, according to an exemplary embodiment, includes an electrical signal transmission module and a substrate structure. The electrical signal transmission module includes a pair of substrate structures each having first transmission parts and second transmission parts, and interconnectors disposed between the substrate structures. Each of the first transmission parts converts a first externally input electrical signal into an optical signal, transmits the optical signal, converts the optical signal back into the first electrical signal, and outputs the first electrical signal. Each of the second transmission parts transmits a second externally input electrical signal and outputs the second electrical signal. The interconnectors connect the first transmission parts and the second transmission parts, respectively. The substrate structure is connected to the first transmission part and the second transmission part, the substrate structure including probes formed on a surface of the substrate structure, the probes making contact with an object.

BRIEF DESCRIPTION OF THE DRAWINGS

Exemplary embodiments will become apparent by reference to the following detailed description taken in conjunction with the accompanying drawings, wherein.

DETAILED DESCRIPTION OF THE INVENTION

Figure 1:
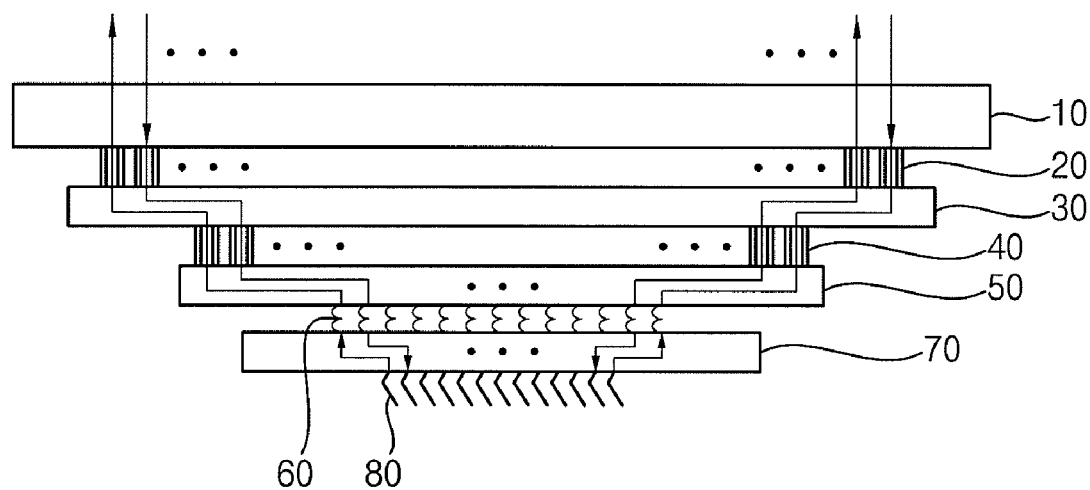
FIG. 1 is a block diagram illustrating a conventional electrical inspection apparatus.

The present invention will be described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. Like numerals refer to like elements throughout.

Hereinafter, exemplary embodiments will be explained in detail with reference to the accompanying drawings.

Figure 2:
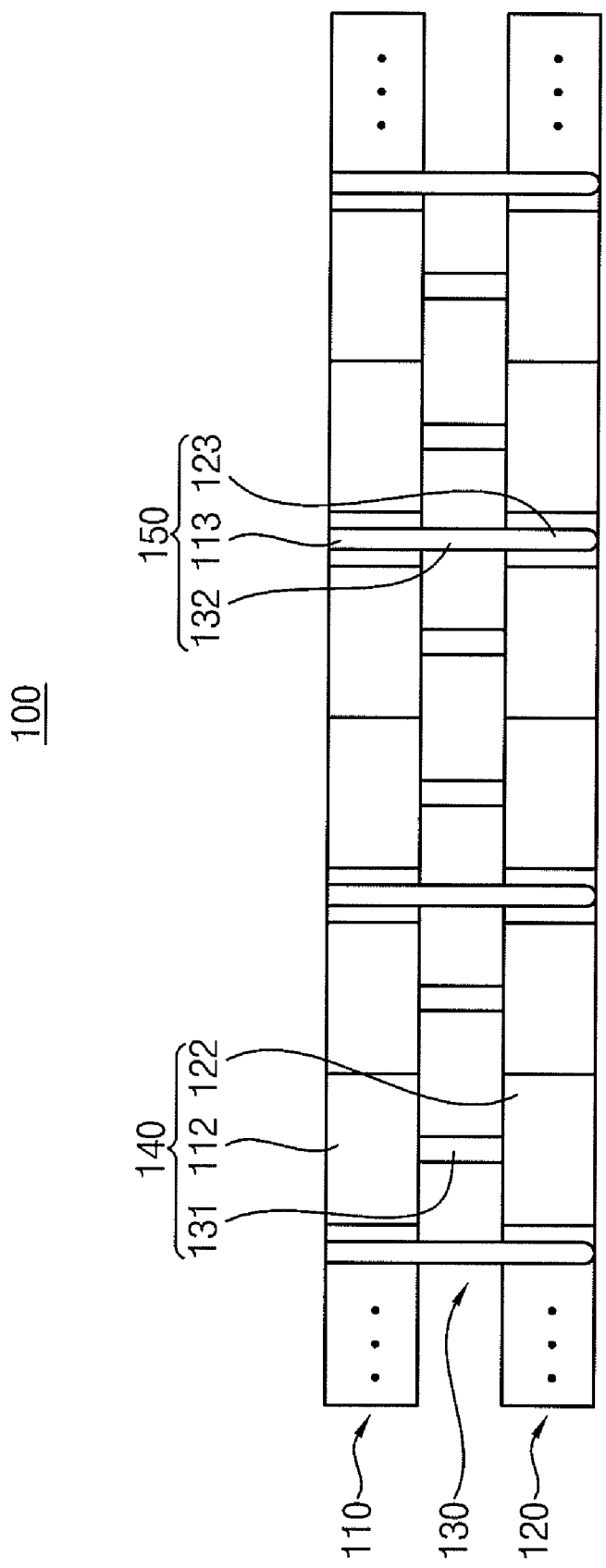
FIG. 2 is a block diagram illustrating an electrical signal transmission module in accordance with an exemplary embodiment of the present invention.

FIG. 2 is a block diagram illustrating an electrical signal transmission module in accordance with an exemplary embodiment.

Referring to FIG. 2, the electrical signal transmission module 100 includes a first substrate structure 110, a second substrate structure 120, and interconnectors 130.

Figure 3:
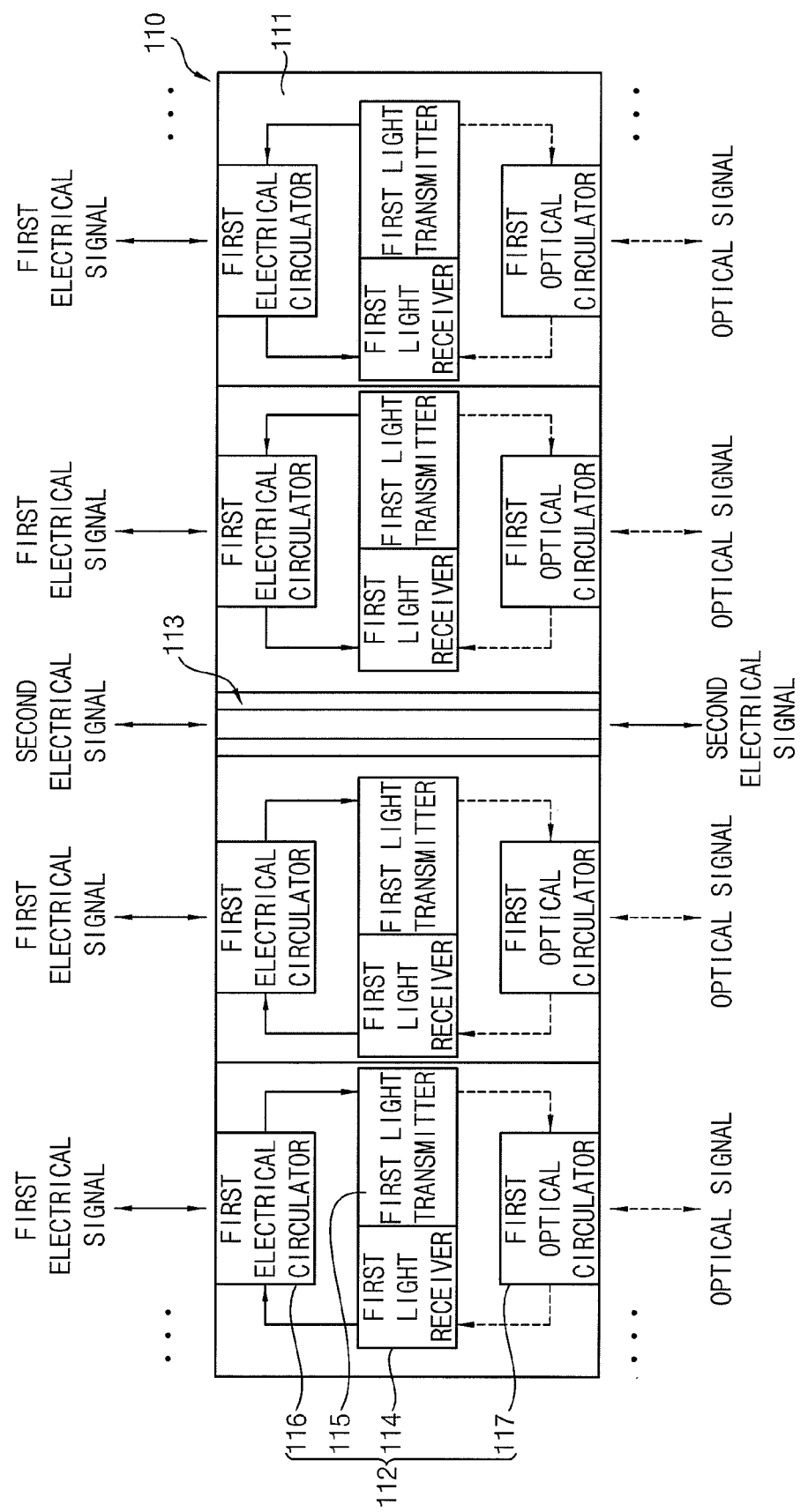
FIG. 3 is a block diagram illustrating a first substrate structure of the signal transmission nodule of FIG. 2.

FIG. 3 is a block diagram illustrating the first substrate structure 110 of FIG. 2. Referring to FIG. 3, the first substrate structure 110 includes a first substrate 111, first transmission parts 112, and second transmission parts 113 provided in the first substrate 111.

Each of the first transmission parts 112 converts a first electrical signal that is externally provided into an optical signal, and converts an optical signal that is externally provided into the first electrical signal. Each of the first transmission parts 112 includes a first light receiver 114, a first light transmitter 115, a first electrical circulator 116, and a first optical circulator 117.

The first light receiver 114 converts the optical signal into the first electrical signal. An example of the first light receiver 114 may be a laser diode.

The first light transmitter 115 converts the first electrical signal into the optical signal. Examples of the first light transmitter 115 may be a photodiode, a photodetector, etc.

The first electrical circulator 116 may be a circuit device having signal branches including three terminals. The first electrical circulator 116 is connected to the first light receiver 114 and the first light transmitter 115, respectively. The first electrical circulator 116 transmits the first electrical signal to the first light transmitter 115. The first electrical circulator 116 outputs a first electrical signal outputted from the first light receiver 114. Accordingly, the first electrical circulator 116 inputs and outputs the first electrical signal.

The first optical circulator 117 may be a circuit device having signal branches including three terminals. The first optical circulator 117 is connected to the first light receiver 114 and the first light transmitter 115, respectively. The first optical circulator 117 transmits the optical signal to the first light receiver 114. The first optical circulator 117 outputs an optical signal outputted from the first light transmitter 115. Accordingly, the first electrical circulator 116 inputs and outputs the optical signal.

The first electrical circulator 116 is provided on a first face of the first substrate 111. The first optical circulator 117 is provided on a second face of the first substrate 111 opposite to the first face.

Accordingly, in each of the first transmission parts 112, the first electrical signal is inputted and outputted through the first face of the first substrate 111, and the optical signal is inputted and outputted through the second face of the first substrate 111.

The second transmission part 113 outputs a second electrical signal. In an exemplary embodiment, the second electrical signal may not be converted by the second transmission part 113. The second transmission part 113 may bidirectionally transmit the second electrical signal. Accordingly, in the second transmission part 113, the second electrical signal is inputted and outputted through the first face of the first substrate 111, and the second electrical signal is inputted and outputted through the second face of the first substrate 111.

Figure 4:
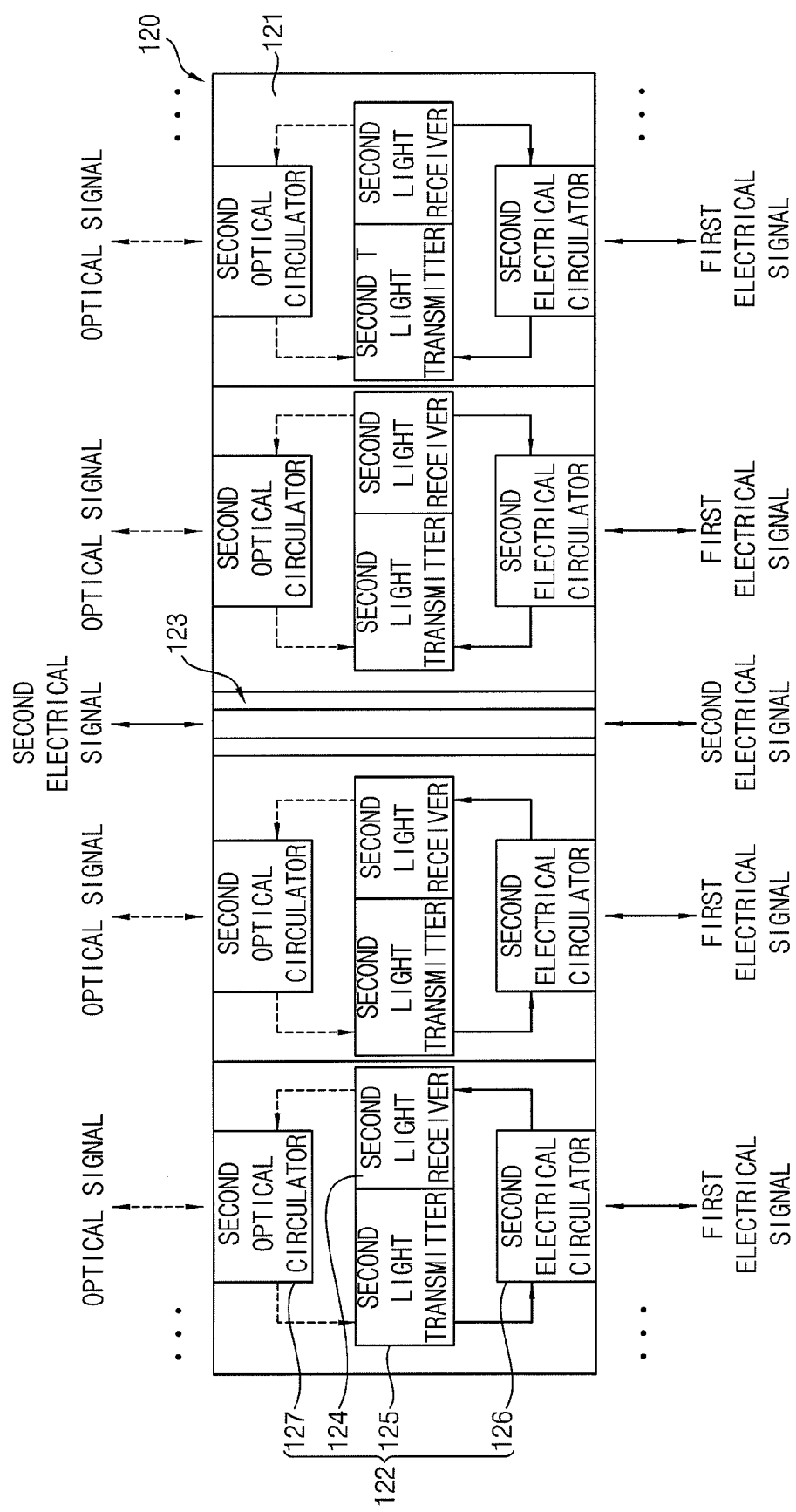
FIG. 4 is a block diagram illustrating a second substrate structure of the signal transmission nodule of FIG. 2.

FIG. 4 is a block diagram illustrating the second substrate structure of FIG. 2.

Referring to FIG. 4, the second substrate structure 120 includes a second substrate 121, third transmission parts 122, and fourth transmission parts 123 provided in the second substrate 121.

Each of the third transmission parts 122 converts an inputted first electrical signal into an optical signal, and converts an inputted optical signal into the first electrical signal. Each of the third transmission parts 122 includes a second light receiver 124, a second light transmitter 125, a second electrical circulator 126, and a second optical circulator 127.

The second substrate 121, the third transmission parts 122, and the fourth transmission parts 123 of the second substrate structure 120 may be substantially the same as the first substrate 111, the first transmission parts 112, and the second transmission parts 113 of the first substrate structure 110, so their detailed explanations will be omitted.

The second optical circulator 127 of the second substrate structure 120 is disposed to face the first optical circulator 117 of the first substrate structure 110.

The interconnectors 130 of FIG. 2 connect the first substrate structure 110 and the second substrate structure 120. Each of the interconnectors 130 includes optical interconnectors 131 and electrical interconnectors 132.

Each of the optical interconnectors 131 connects each of the first transmission parts 112 of the first substrate structure 110 and each of the third transmission parts 122 of the second substrate structure 120. Each of the optical interconnectors 131 connects the first optical circulator 117 and the second optical circulator 127. Each of the optical interconnectors 131 transmits an optical signal that is outputted from the first optical circulator 117 to the second optical circulator 127, or transmits an optical signal that is outputted from the second optical circulator 127 to the first second optical circulator 117. An example of the optical interconnectors 131 may be an optical fiber.

The electrical interconnectors 132 connect the second transmission parts 113 of the first substrate structure 110 to the fourth transmission parts 123 of the second substrate structure 120. Each of the electrical interconnectors 132 transmits the second electrical signal that is outputted from each of the second transmission parts 113 to each of the fourth transmission parts 123, or transmits the second electrical signal that is outputted from each of the fourth transmission parts 123 to each of the second transmission parts 113. An example of the electrical interconnectors 132 may be a coaxial cable.

Each of the first transmission parts 112 of the first substrate structure 110, each of the third transmission parts 122 of the second substrate structure 120, and each of the optical interconnectors 131 of the interconnectors 130 connecting each of the first transmission parts 112 and each of the third transmission parts 122 form an optical signal line 140. The optical signal line 140 converts the first electrical signal that is provided to any one of the first transmission parts 112 and the third transmission parts 122 into an optical signal. The converted optical signal is transmitted through each of the optical interconnectors 131. The optical signal line 140 converts the optical signal that is outputted from any one of the first transmission parts 112 and the third transmission parts 122 into the first electrical signal, and then outputs the first electrical signal.

Each of the second transmission parts 113 of the first substrate structure 110, each of the fourth transmission parts 123 of the second substrate structure 120, and each of the electrical interconnectors 132 of the interconnectors 130 connecting each of the second transmission parts 113 and each of the fourth transmission parts 123 form an electrical signal line 150. The second electrical signal that is provided to any one of the second transmission parts 113 and the fourth transmission parts 123 is transmitted unconverted through the electrical interconnectors 132. The electrical signal line 150 outputs the second electrical signal, which is outputted unconverted from any one of the second transmission parts 113 and the fourth transmission parts 123.

In an exemplary embodiment, the first electrical signal may be of substantially the same type as the second electrical signal. For example, the first electrical signal and the second electrical signal may be an alternating current (AC) signal.

The first electrical signal may also be of a different type from the second electrical signal. For example, the first electrical signal may be an AC signal and the second electrical signal may be a direct current (DC) signal.

Examples of the AC signal may be an input/output (I/O) signal, an address signal, etc. Examples of the DC signal may be a power supply current.

The electrical signal line 150 may require a ground line for grounding because the second electrical signal is transmitted unconverted through the electrical signal line 150. However, because the first electrical signal is converted into the optical signal by the optical signal line 140, the optical signal line may not require a ground line. Therefore, the electrical signal transmission module 100 may be more highly integrated than a conventional electrical signal transmission module including a pair of electrical signal lines and ground lines. The electrical signal transmission module 100 may have more of the optical signal lines 140 and the electrical signal lines 150 in a limited space.

Figure 5:
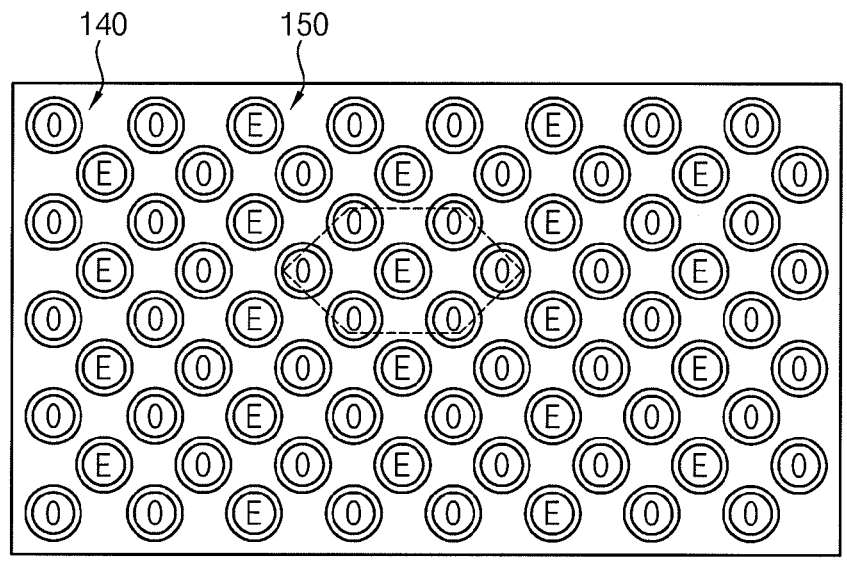
FIG. 5 is a plan view illustrating patterns of optical signal lines and electrical signal lines of the signal transmission nodule of FIG. 2 in accordance with an exemplary embodiment.

FIG. 5 is a plan view illustrating patterns of optical signal lines and electrical signal lines of the signal transmission line of FIG. 2 in accordance with an exemplary embodiment.

Referring to FIG. 5, each of the electrical signal lines 150 is surrounded by the optical signal lines 140. The second transmission parts 113 are surrounded by the first transmission parts 112. The fourth transmission parts 123 are surrounded by the third transmission parts 122. Each of the electrical interconnectors 132 is surrounded by the optical interconnectors 131.

The optical signal lines 140 may have various shapes centering around each of the electrical signal lines 150. For example, the optical signal lines 140 may have a hexagonal shape centering around each of the electrical signal lines 150.

The optical signal lines 140 may be arranged to have a repetitive pattern, and thus the degree of integration of the optical signal lines 140 may be increased. Further, since the electrical signal lines 150 are spaced from one another by the optical signal lines 140, crosstalk between the electrical signal lines 150 may be reduced.

Figure 6:
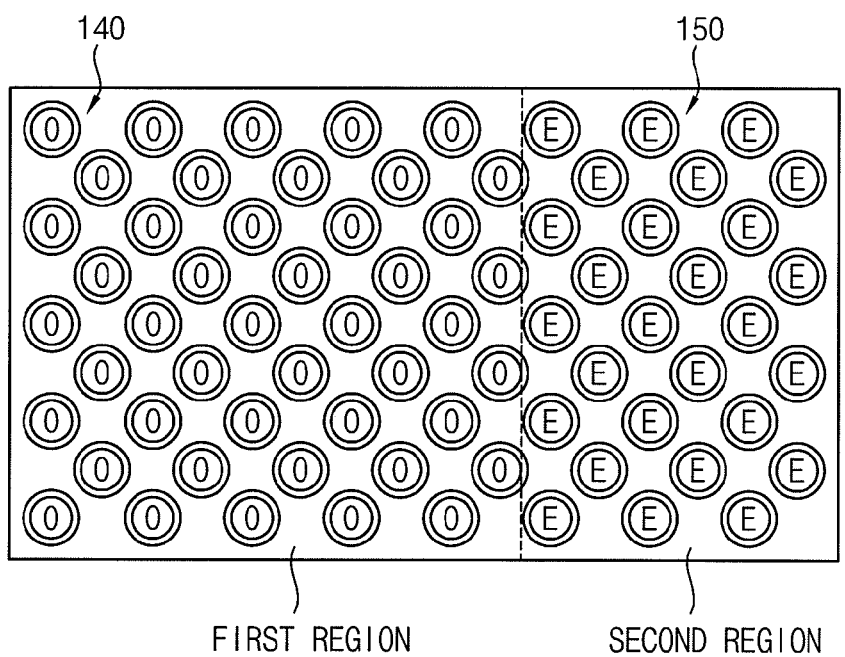
FIG. 6 is a plan view illustrating patterns of optical signal lines and electrical signal lines of the signal transmission nodule of FIG. 2 in accordance with an exemplary embodiment.

FIG. 6 is a plan view illustrating patterns of optical signal lines and electrical signal lines of the signal transmission line of FIG. 2 in accordance with an exemplary embodiment.

Referring to FIG. 6, the optical signal lines 140 are disposed in a first region and the electrical signal lines 150 are disposed in a second region. The first region may be adjacent to the second region. The optical signal lines 140 are only disposed in the first region and the electrical signal lines 150 are disposed in the second region. In particular, the first transmission parts 112 are disposed in the first region of the first substrate 111, and the second transmission parts 113 are disposed in the second region of the first substrate 111 which excludes the first region. The third transmission parts 122 are disposed in the first region of the second substrate 121, and the fourth transmission parts 123 are disposed in the second region of the second substrate 121 which excludes the first region. The optical interconnectors 131 are disposed in the first region and the electrical interconnectors 132 are disposed in the second region.

The second electrical signal that is transmitted through the electrical signal lines 150 may be a DC power signal that may not significantly affect a signal transmission even when loss of the power signal occurs due to crosstalk between the adjacent electrical signal lines 150.

Accordingly, the degree of integration of the optical signal lines 140 and the electrical signal lines 150 of the electrical signal transmission module 100 may be increased and crosstalk between the electrical signal lines 150 may be reduced. Further, the signal transmission module 100 includes the optical signal lines 140 to transmit signals at a high speed.

Figure 7:
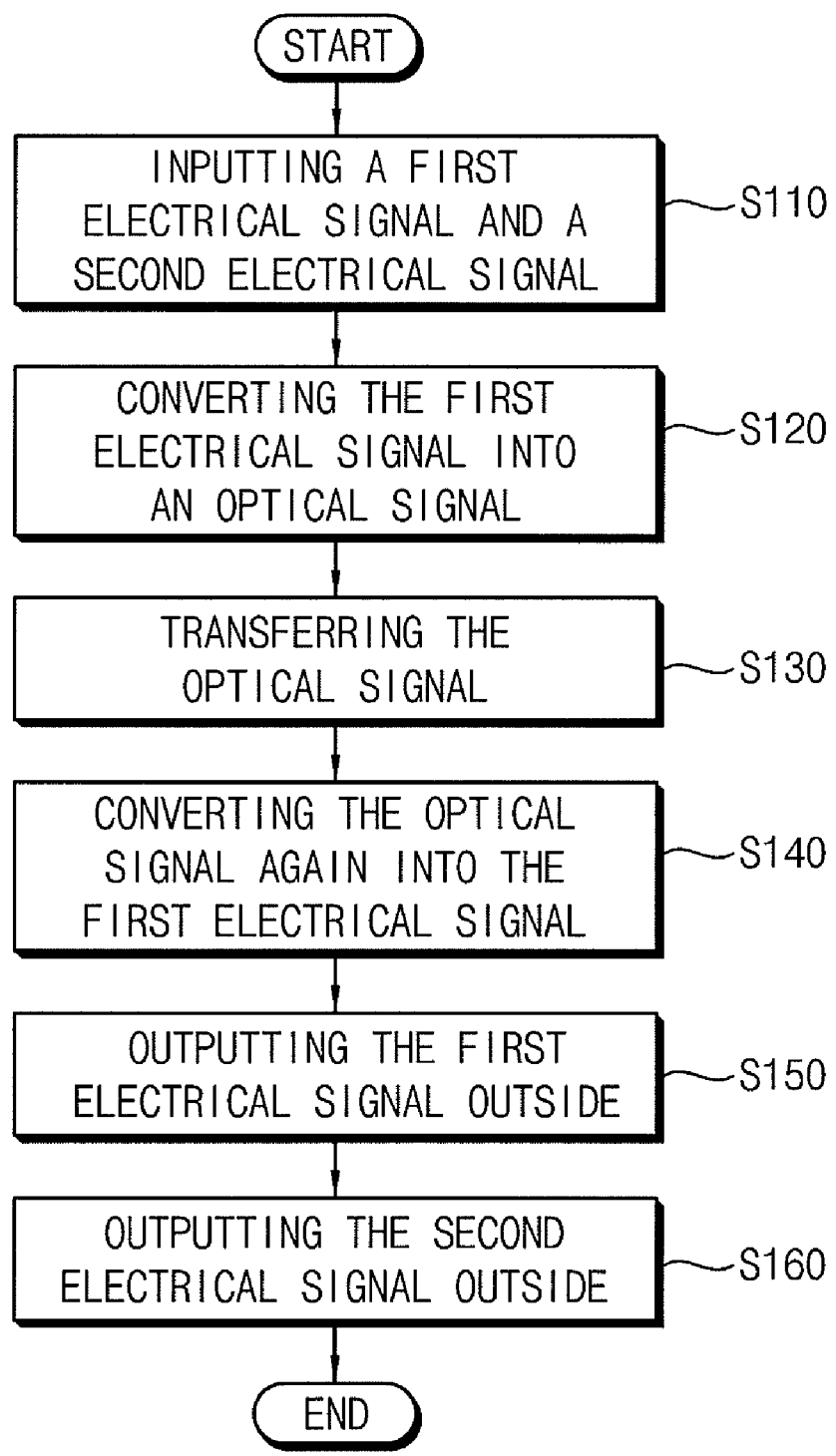
FIG. 7 is a flowchart illustrating a method of transmitting an electrical signal in accordance with an exemplary embodiment.

FIG. 7 is a flowchart illustrating a method of transmitting an electrical signal in accordance with an exemplary embodiment.

Referring to FIG. 7, a first electrical signal and a second electrical signal are externally input (step S110).

The first electrical signal is inputted to each of the first transmission parts 112 and the second electrical signal is inputted to each of the second transmission parts 113.

The first electrical signal may be of substantially the same type as the second electrical signal. For example, the first electrical signal and the second electrical signal may be an AC signal.

The first electrical signal may also be of a different type from the second electrical signal. For example, the first electrical signal may be an AC signal and the second electrical signal may be a DC signal.

Examples of the AC signal may be an I/O signal, an address signal, etc. Examples of the DC signal may be a power supply current.

The input first electrical signal is converted into an optical signal (step S120).

The first electrical signal is transmitted from the first electrical circulator 116 of each of the first transmission parts 112 to the first light transmitter 115 to be converted into the optical signal.

The optical signal is transmitted to another transmission part (step S130).

After the optical signal is outputted from the first optical circulator 117, the optical signal is transmitted to the second optical circulator 127 of each of the third transmission parts 122 through each of the optical interconnectors 131 of the interconnectors 130.

The optical signal is converted back into the first electrical signal (step S140).

The optical signal that is inputted to the second optical circulator 127 is applied to the second light receiver 123, and then the optical signal is converted back into the first electrical signal by the second light transmitter 125.

Then, the first electrical signal is output externally (step S150).

The first electrical signal that is converted back is output externally through the second electrical circulator 126.

The second electrical signal is output externally (step S160).

The second electrical signal that is inputted to each of the second transmission parts 113 is transmitted to each of the fourth transmission parts 123 through the electrical interconnectors 132, and then the second electrical signal is externally output outside from each of the fourth transmission parts 123.

On the other hand, the first electrical signal is inputted to each of the third transmission parts 122 and is converted into the optical signal, and then the optical signal is transmitted to each of the first transmission parts 112 through the optical interconnectors 131, converted into the first electrical signal by each of the first transmission parts 112 and outputted from each of the first transmission parts 112. The second electrical signal is inputted to each of the fourth transmission parts 123, transmitted to each of the second transmission parts 113 through the electrical interconnectors 132 and then the second electrical signal is externally output from each of the second transmission parts 113.

When the electrical signal is converted and transmitted into an optical signal, a signal of higher than about 1 GHz may be transmitted without loss.

Figure 8:
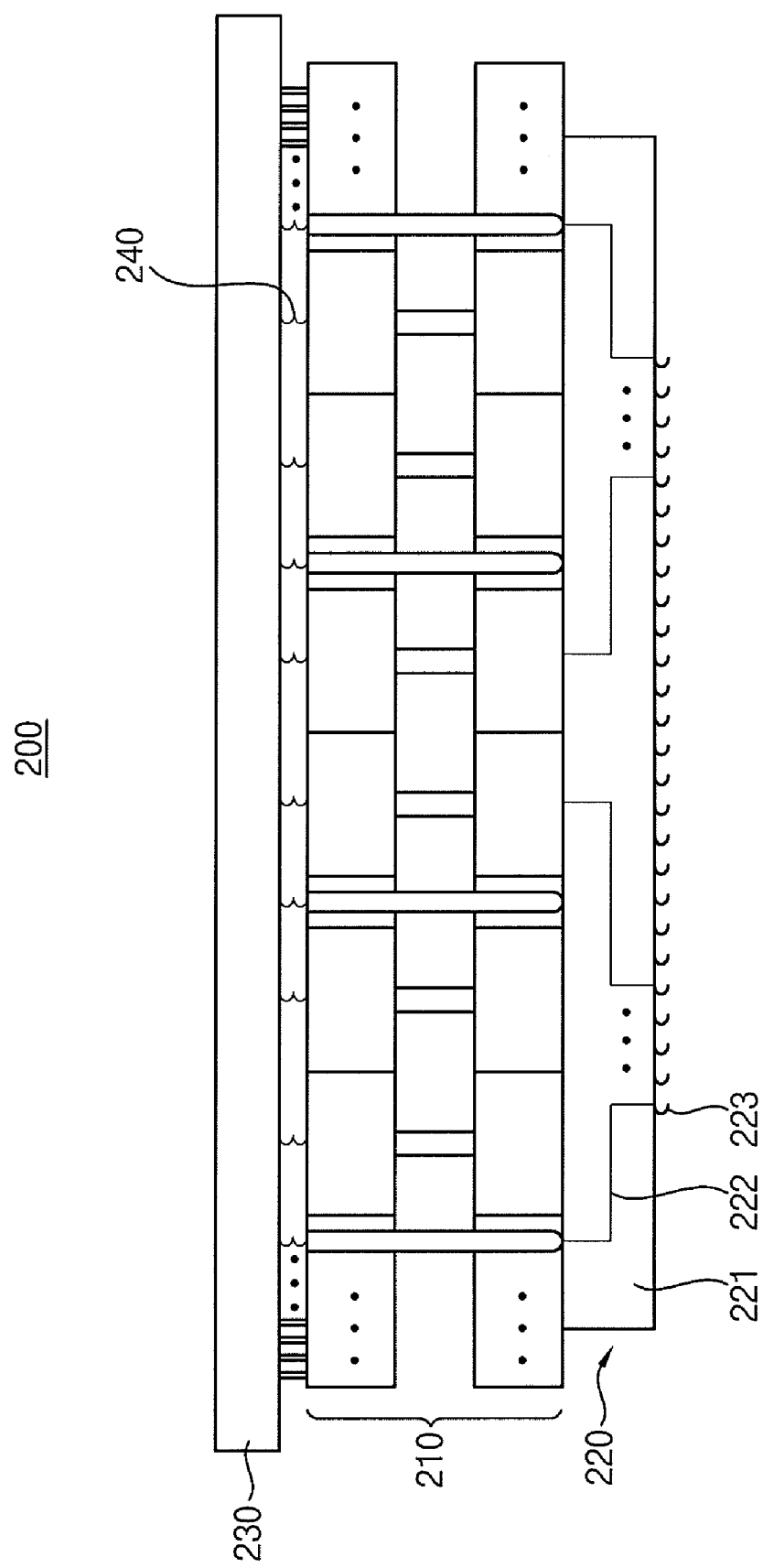
FIG. 8 is a block diagram illustrating an electrical inspection apparatus in accordance with an exemplary embodiment.

FIG. 8 is a block diagram illustrating an electrical inspection apparatus in accordance with an exemplary embodiment.

Referring to FIG. 8, the electrical inspection apparatus 200 includes an electrical signal transmission module 210, a substrate structure 220, a test header 230, and an elastic interconnector 240.

The electrical signal transmission module 210 includes a first substrate structure, a second substrate structure, and an interconnector that form optical signal lines and electrical signal lines.

The first substrate structure, the second substrate structure and the interconnector of the present embodiments may be substantially the same as those of the electrical signal transmission module 100 of FIGS. 2 to 6, so their detailed explanations will be omitted.

The substrate structure 220 includes a substrate 221, signal lines 222, and probes 223.

The substrate may have a plate shape. The signal lines 222 are provided within the substrate 221. The signal lines 222 may include a multilayer wiring and a conductive plug that connects the multilayer wiring. The probes 223 extend from a lower surface of the substrate 221. The probes 223 are electrically connected to the signal lines 222, respectively. The probes 223 make contact with an object. The object may be a semiconductor device or a semiconductor package.

The substrate structure 220 is disposed under the electrical signal transmission module 210. For example, the substrate structure 220 makes contact with a lower surface of the electrical signal transmission module 210. Accordingly, the signal lines 222 of the substrate structure 220 are directly connected to the optical signal lines and the electrical signal lines of the electrical signal transmission module 210. Alternatively, the substrate structure 220 is spaced apart from the lower surface of the electrical signal transmission module 210. Accordingly, the signal lines 222 of the substrate structure 220 are connected to the optical signal lines and the electrical signal lines of the electrical signal transmission module 210 by an interconnector.

The test header 230 is disposed on the electrical signal transmission module 210. The test header 230 supports the electrical signal transmission module 210. The test header 230 includes a signal line that is electrically connected to a separate test apparatus (not illustrated). Examples of the test header 230 may be a printed circuit board (PCB), a multilayer substrate, etc.

The elastic interconnector 240 electrically connects the test header 230 and the electrical signal transmission module 210.

The electrical inspection apparatus 200 transmits an electrical signal to inspect the object. In the electrical inspection apparatus 200, a first electrical signal that is outputted from the test apparatus is transmitted converted into an optical signal, the optical signal is converted back into the first electrical signal and then the first electrical signal is transmitted to the object. The first electric signal that is outputted from the object is transmitted converted into the optical signal, the optical signal is converted back into the first electrical signal and then the first electrical signal is transmitted to the test apparatus. Further, a second electrical signal that is outputted from the test apparatus is transmitted unconverted to the object and then the second electric signal that is outputted from the object is transmitted unconverted to the test apparatus.

The electrical inspection apparatus 200 converts the first electrical signal into the optical signal to transmit the electrical signal at a high speed. Therefore, the electrical inspection apparatus 200 may accurately inspect the semiconductor device having an operation speed of higher than about 1 GHz.

According to an exemplary embodiment of the present invention, in an electrical signal transmission module, an electrical signal that is applied thereto is transmitted converted into an optical signal and then the optical signal is transmitted converted back to the electrical signal and is externally output. Thus, the electrical signal transmission module may transmit an electrical signal higher than about 1 GHz without loss or distortion thereof. Further, the electrical signal transmission module may have a high degree of integration and precise signal wirings, and also crosstalk of the electrical signal due to the high degree of integration thereof is prevented.

An electrical inspection apparatus including the electrical signal transmission module may transmit and receive the electrical signal at a high speed, accurately and with relatively low noise. Therefore, the electrical inspection apparatus may accurately inspect a semiconductor device having an operation speed of higher than about 1 GHz.

The foregoing is illustrative of the present invention and is not to be construed as limiting thereof. Although a few exemplary embodiments of the present invention have been described, those skilled in the art will readily appreciate that many modifications are possible in the exemplary embodiments without departing from the scope and spirit of the disclosure.

What is claimed is:

1. An electrical signal transmission module, comprising:
a plurality of optical signal lines converting a first externally input electrical signal into an optical signal, transmitting the optical signal, converting the optical signal back into the first electrical signal, and outputting the first electrical signal; and
a plurality of electrical signal lines transmitting a second externally input electrical signal and outputting the second electrical signal,
wherein each of the electrical signal lines is surrounded by the optical signal lines;
wherein each of the optical signal lines comprises:
a pair of transmission parts converting the first externally input electrical signal into the optical signal, converting the optical signal back into the first electrical signal, and outputting the first electrical signal; and
an optical fiber connecting the transmission parts and transmitting the optical signal;
wherein each of the transmission parts comprises:
a light transmitter converting the first externally input electrical signal into the optical signal;
a light receiver converting the optical signal back into the first electrical signal;
an electrical circulator transmitting the first externally input electrical signal to the light transmitter and outputting the first electrical signal that is transmitted from the light receiver; and
an optical circulator transmitting the optical signal converted by the light transmitter to the optical fiber and transmitting the optical signal that is transmitted from the optical fiber to the light receiver.

2. The electrical signal transmission module of claim 1, wherein the light receiver comprises a laser diode and the light transmitter comprises one of a photodiode or a photodetector.

3. The electrical signal transmission module of claim 1, wherein each of the electrical signal lines comprises a coaxial cable.

4. The electrical signal transmission module of claim 1, wherein each of the electrical signal lines further comprises a ground line.

5. The electrical signal transmission module of claim 1, wherein the optical signal lines are disposed in a first region and the electrical signal lines are disposed in a second region adjacent to the first region.

6. The electrical signal transmission module of claim 1, wherein the first electrical signal is of a same type as the second electrical signal.

7. The electrical signal transmission module of claim 1, wherein the first electrical signal is of a different type from the second electrical signal.

8. An electrical signal transmission module, comprising:
a plurality of optical signal lines converting a first externally input electrical signal into an optical signal, transmitting the optical signal, converting the optical signal back into the first electrical signal, and outputting the first electrical signal; and
a plurality of electrical signal lines transmitting a second externally input electrical signal and outputting the second electrical signal,
wherein each of the electrical signal lines is surrounded by the optical signal lines; wherein the first electrical signal and the second electrical signal are alternating current (AC) signals.

9. An electrical signal transmission module, comprising:
a plurality of optical signal lines converting a first externally input electrical signal into an optical signal, transmitting the optical signal, converting the optical signal back into the first electrical signal, and outputting the first electrical signal; and a plurality of electrical signal lines transmitting a second externally input electrical signal and outputting the second electrical signal, wherein each of the electrical signal lines is surrounded by the optical signal lines; wherein the first electrical signal is an AC signal and the second electrical signal is a direct current (DC) signal.

10. An electrical signal transmission module, comprising:
a pair of substrate structures each including first transmission parts and second transmission parts, each of the first transmission parts converting a first externally input electrical signal into an optical signal, transmitting the optical signal, converting the optical signal back into the first electrical signal, and outputting the first electrical signal, and each of the second transmission parts transmitting a second externally input electrical signal and outputting the second electrical signal; and
interconnectors disposed between the substrate structures, the interconnectors connecting the first transmission parts and the second transmission parts, respectively;
wherein the interconnectors comprise:
optical interconnectors connecting the first transmission parts to one another and transmitting optical signals; and
electrical interconnectors connecting the second transmission parts to one another and transmitting electrical signals;
wherein each of the first transmission parts comprises:
a light transmitter converting the first externally input electrical signal into the optical signal;
a light receiver converting the optical signal back into the first electrical signal;
an electrical circulator transmitting the first externally input electrical signal to the light transmitter and outputting the first electrical signal that is transmitted from the light receiver; and
an optical circulator transmitting the optical signal converted by the light transmitter to a respective interconnector and transmitting the optical signal that is transmitted from the interconnector to the light receiver.

11. The electrical signal transmission module of claim 10, wherein each of the second transmission parts is surrounded by the first transmission parts.

12. The electrical signal transmission module of claim 10, wherein the first transmission parts are disposed in a first region and the second transmission parts are disposed in a second region adjacent to the first region.

13. A method of transmitting an electrical signal, comprising:
receiving a first externally input electrical signal and a second externally input electrical signal;
converting the first externally input electrical signal into an optical signal;
transmitting the optical signal;
converting back the transmitted optical signal into the first electrical signal;
outputting the first electrical signal; and
outputting the second electrical signal,
wherein the first electrical signal is an AC signal and the second electrical signal is a DC signal.

* * * * *